(12) United States Patent
Kwon et al.

(10) Patent No.: US 8,879,298 B2
(45) Date of Patent: Nov. 4, 2014

(54) E-FUSE ARRAY CIRCUIT

(71) Applicant: SK hynix Inc., Gyeonggi-do (KR)

(72) Inventors: Igsoo Kwon, San Jose, CA (US);
Yeonuk Kim, Gyeonggi-do (KR);
Youncheul Kim, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 176 days.

(21) Appl. No.: 13/672,299

(22) Filed: Nov. 8, 2012

(65) Prior Publication Data

US 2014/0126317 A1 May 8, 2014

(51) Int. Cl.
*G11C 17/00* (2006.01)

(52) U.S. Cl.
USPC ........................................ 365/96; 365/189.09

(58) Field of Classification Search
USPC ........................................ 365/96, 189.09, 174
See application file for complete search history.

(56) References Cited

U.S. PATENT DOCUMENTS 7,345,931 B2 * 3/2008 Partsch et al. ............ 365/189.09

\* cited by examiner

*Primary Examiner* — Vu Le
(74) *Attorney, Agent, or Firm* — IP & T Group LLP

(57) ABSTRACT

An e-fuse array circuit includes a high voltage pumping unit configured to generate a high voltage by pumping a power source voltage, a negative voltage pumping unit configured to generate a negative voltage by pumping a ground voltage, a program/read line supplied with the high voltage when a program operation is activated, a read voltage, which is lower than the high voltage, when a read operation is activated, or the negative voltage when deactivated, a row line supplied with the ground voltage when the row line is activated or the negative voltage when the row line is deactivated, an e-fuse device supplied with voltage of the program/read line, a switch device controlled by the row line and configured to electrically connect the e-fuse device with a column line, and a column circuit configured to supply the negative voltage to the column line when the column line is activated.

11 Claims, 5 Drawing Sheets

US 8,879,298 B2

E-FUSE ARRAY CIRCUIT

BACKGROUND

1. Field

An exemplary embodiment of the present invention relates to an e-fuse array circuit.

2. Description of the Related Art

A common fuse may be programmed in a wafer state because the data of the fuse is determined based on whether the fuse is cut by a laser or not. However, it is difficult to program the fuse after the wafer is mounted on a package. An e-fuse is used to overcome the disadvantage. The e-fuse stores data by changing resistance between a gate and a source by using a transistor.

FIG. 1 is a diagram illustrating an e-fuse including a transistor. The e-fuse may operate as a resistor or a capacitor.

Referring to FIG. 1, the e-fuse includes a transistor T. A power source voltage is supplied to the gate G of the transistor T, and a ground voltage is supplied to the drain/source D/S thereof.

If a common power source voltage that the transistor may tolerate is supplied to the gate, the e-fuse operates as a capacitor C. Accordingly, there is no electric current that flows between the gate G and the drain/source D/S. If a high power source voltage that the transistor T may not tolerate is supplied to the gate G, the gate oxide of the transistor T is ruptured, and the gate G and the drain/source D/S are shorted, so that the e-fuse operates as a resistor. Accordingly, an electric current flows between the gate G and the drain/source D/S. The data of the e-fuse is determined based on a resistance value between the gate G and the drain/source D/S of the e-fuse using this phenomenon. Here, the data of the e-fuse may be immediately determined without an additional sensing operation by (1) increasing the size of the transistor T or (2) reducing the size of the transistor T and sensing an electric current flowing through the transistor T using an amplifier. The two methods may not be effectively used, because the size of the transistor T that forms the e-fuse must be increased, or the amplifier for amplifying data must be included in each e-fuse.

SUMMARY

Exemplary embodiments of the present invention are directed to minimize an area occupied by an e-fuse circuit by forming e-fuses in an array form.

Other exemplary embodiments of the present invention are directed to improve the current consumption efficiency of a circuit for generating voltages that are used to operate an e-fuse circuit by optimizing the level of voltages used by the e-fuse circuit.

In accordance with an embodiment of the present invention, an e-fuse array circuit includes a high voltage pumping unit configured to generate a high voltage by pumping a power source voltage, a negative voltage pumping unit configured to generate a negative voltage by pumping a ground voltage, a program/read line supplied with the high voltage when a program operation is activated, a read voltage, which is lower than the high voltage, when a read operation is activated, or the negative voltage when deactivated, a row line supplied with the ground voltage when the row line is activated or the negative voltage when the row line is deactivated, an e-fuse device supplied with voltage of the program/read line, a switch device controlled by the row line and configured to electrically connect the e-fuse device with a column line, and a column circuit configured to supply the negative voltage to the column line when the column line is activated.

In accordance with another embodiment of the present invention, an e-fuse array circuit includes a high voltage pumping unit configured to generate a high voltage by pumping a power source voltage, a negative voltage pumping unit configured to generate a negative voltage by pumping a ground voltage, a plurality of memory cells arranged in a plurality of rows and a plurality of columns, and each configured to include an e-fuse device and a switch device, a plurality of program/read lines configured to control the e-fuse devices of the plurality of memory cells, a plurality of row lines configured to control the switch devices of the plurality of memory cells, a plurality of column lines electrically connected to the e-fuse devices through the switch devices of the plurality of memory cells, a row circuit configured to supply the high voltage to a program/read line corresponding to a selected row when a program operation is performed, supply a read voltage, which is lower than the high voltage, to a program/read line corresponding to a selected row when a read operation is performed, supply the ground voltage to a row line corresponding to a selected row when program and read operations are performed, and supply the negative voltage to program/read lines and row lines corresponding to unselected rows when program and read operations are performed, and a column circuit configured to supply the negative voltage to a column line corresponding to a selected column when program and read operations are performed.

DETAILED DESCRIPTION

Figure 1:
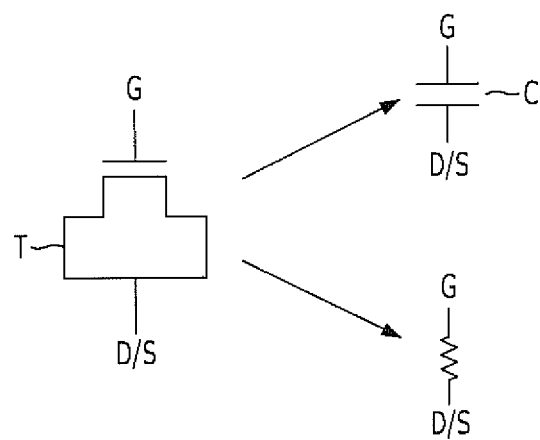
FIG. 1 is a diagram illustrating an e-fuse including a transistor and that the e-fuse operates as a resistor or a capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
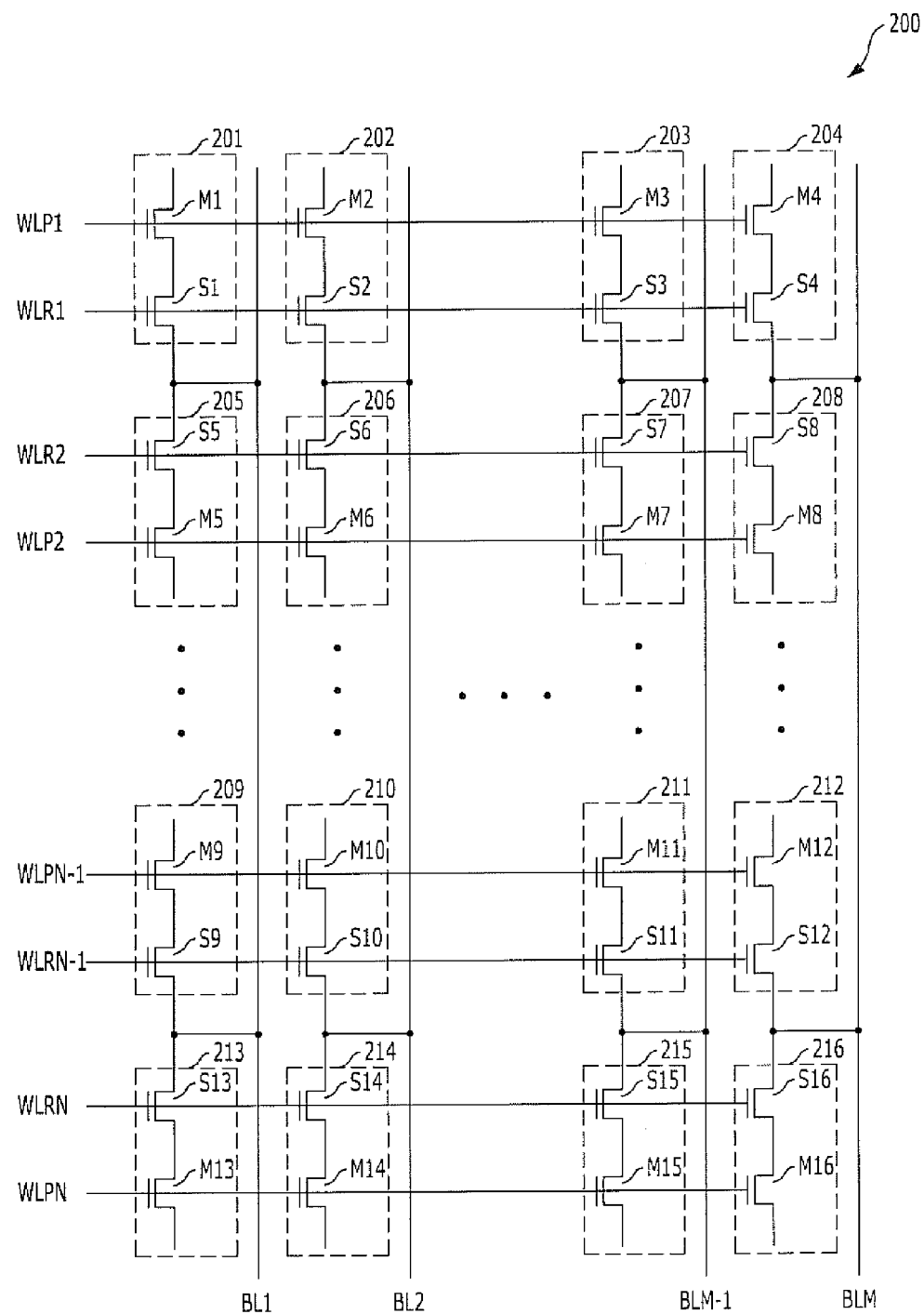
FIG. 2 is a circuit diagram of a cell array 200 including an e-fuse in accordance with one embodiment of the present invention.

FIG. 2 is a circuit diagram of a cell array 200 including an e-fuse in accordance with one embodiment of the present invention.

Referring to FIG. 2, the cell array 200 includes memory cells 201 to 216 arranged in N rows and M columns. The memory cells 201 to 216 include respective memory devices M1 to M16 and switch devices S1 to S16. Each of the memory devices is an e-fuse that has the properties of a resistor or capacitor depending on whether the e-fuse is ruptured or not. That is, each of the e-fuses M1 to M16 may be considered as a resistive memory device for storing data based on the amount of resistance. The switch devices S1 to S16 electrically connect the memory devices M1 to M16 to column lines BL1 to BLM under the control of row lines WLR1 to WLRN.

Hereinafter, a second row will be referred to as a selected row, and an $M^{th}$ column will be referred to as a selected column. That is, the memory cell 208 is a selected memory cell. Voltages supplied to the selected memory cell 208 and the remaining unselected memory cells 201 to 207 and 209 to 216 when program and read operations are performed are described below.

Program Operation

The selected row line WLR2 is activated, and the remaining row lines WLR1 and WLR3 to WLRN are deactivated. Here, an activation voltage capable of turning on the switch devices S5 to S8 has to be supplied to the activated row line WLR2, and a deactivation voltage capable of turning off the switch devices S1 to S4 and S9 to S16 has to be supplied to the deactivated row lines WLR1 and WLR3 to WLRN. Accordingly, the switch devices S5 to S8 are turned on, and the switch devices S1 to S4 and S9 to S16 are turned off. A high program voltage, which may rupture the gate oxide of the e-fuse, has to be supplied to a program/read line WLP2 corresponding to the selected row. In order to rupture the gate oxide of the e-fuse, a voltage difference between the gate and the drain/source of the e-fuse has to be maintained at about 6V. That is, a program voltage supplied to the gate of the selected e-fuse M8, which is to be programmed, and voltage supplied to the selected column line BLM corresponding to the e-fuse M8 have to maintain a potential difference of 6V. A deactivation voltage is supplied to the unselected program/read lines WLP1 and WLP3 to WLPN. In order to program the e-fuse M8, the deactivation voltage from a column circuit, which will be described later, is supplied to the column line BLM. To prevent the unselected e-fuses M5 to M7 form being programmed, the unselected column lines BL1 to BLM-1 corresponding to the unselected e-fuses M5 to M7 are floated by the column circuit or are supplied with voltage (for example, an activation voltage) higher than the deactivation voltage from the column circuit.

Read Operation

The selected row line WLR2 is activated, and the remaining row lines WLR1 and WLR3 to WLRN are deactivated. Here, an activation voltage capable of turning on the switch devices S5 to S8 has to be supplied to the activated row line WLR2, and a deactivation voltage capable of turning off the switch devices S1 to S4 and S9 to S16 has to be supplied to the deactivated row lines WLR1 and WLR3 to WLRN. Accordingly, the switch devices S5 to S8 are turned on, and the switch devices S1 to S4 and S9 to S16 are turned off. A read voltage (that is, voltage higher than the activation voltage, but lower than a program voltage) suitable for the read operation is supplied to the program/read line WLP2 of the selected row. The deactivation voltage is supplied to the remaining program/read lines WLP1 and WLP3 to WLPN. The column circuit supplies the deactivation voltage to the selected column line BLM and determines whether an electric current flows from the program/read line WLP2 to the column line BLM or not through the e-fuse M8. The column circuit also determines whether the e-fuse M8 has been programmed or not (that is, data is '1' or '0') based on a result of the determination.

One (that is, the column line BLM) of the plurality of column lines BL1 to BLM has been assumed to be a selected column line, but a plurality of column lines may become selected column lines at the same time. In other words, a plurality of memory cells that belongs to one row can be programmed or read at the same time.

Figure 3:
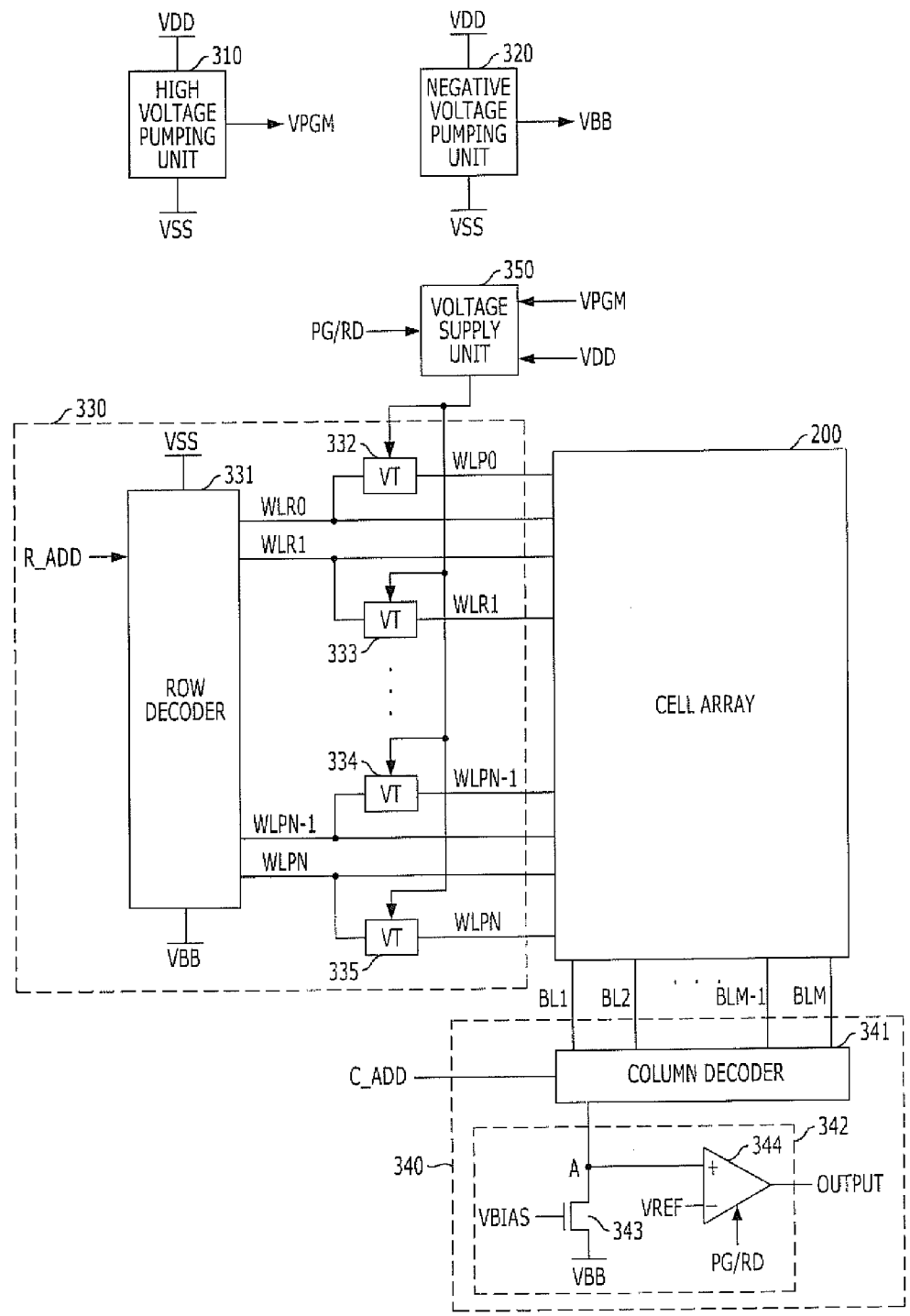
FIG. 3 is a circuit diagram of an e-fuse array circuit in accordance with one embodiment of the present invention.

FIG. 3 is a circuit diagram of an e-fuse array circuit in accordance with one embodiment of the present invention.

Referring to FIG. 3, the e-fuse array circuit includes a high voltage pumping unit 310, a negative voltage pumping unit 320, a cell array 200, a row circuit 330, and a column circuit 340.

The high voltage pumping unit 310 generates a high voltage VPGM that has a higher voltage level than a power source voltage VDD by using the power source voltage VDD, which is received from a source other than the e-fuse array circuit, and a ground voltage VSS. The power source voltage VDD may have a voltage level of about 1 to 2V (hereinafter illustrated as being 2V), and the high voltage VPGM may have a voltage level of about 3.5 to 4.5V (hereinafter illustrated as being 4V).

The negative voltage pumping unit 320 generates a negative voltage VBB that has a lower voltage level than the ground voltage VSS by using the power source voltage VDD, which is received from a source other than the e-fuse array circuit and the ground voltage VSS. The negative voltage VBB can have a level of about −1.5 to −2.5 V (hereinafter illustrated as being −2 V).

The row circuit 330 supplies suitable voltages to the row lines WLR1 to WLRN and the program/read lines WLP1 to WLPN. Such voltages are those described with reference to FIG. 2, when program and read operations are performed. The row circuit 330 includes a row decoder 331 and voltage converters 332 to 335. The row decoder 331 supplies the ground voltage VSS or the activation voltage to a row line selected among the row lines WLR1 to WLRN in response to a row address R_ADD. Alternatively, the row decoder 331 supplies the negative voltage VBB, that is, the deactivation voltage, to the unselected row lines. Each of the voltage converters 332 to 335 supplies the negative voltage VBB to each of the program/read lines WLP1 to WLPN, if voltage of each of the row lines WLR1 to WLRN is same as the negative voltage VBB. Alternatively, each of the voltage converters 332 to 335 supplies voltage received from a voltage supply unit 350 to each of the program/read lines WLP1 to WLPN if voltage of each of the row lines WLR1 to WLRN is same as the ground voltage VSS. The voltage supply unit 350 supplies the program voltage VPGM of the high voltage pumping unit 310 to the voltage converters 332 to 335 when a program operation is performed (for example, PG/RD='H') and supplies the read voltage VDD to the voltage converters 332 to 335 when a read operation is performed (for example, PG/RD='L'). Here, the power source voltage VDD is illustrated as being used as the read voltage, but voltage (that is, voltage higher than the ground voltage VSS, but lower than the power source voltage VDD) divided from the power source voltage VDD may be used as the read voltage.

The column circuit 340 supplies the column lines BL1 to BLM with voltages, such as those described with reference to FIG. 2, when program and read operations are performed. Furthermore, when a read operation is performed, the column circuit 340 detects current flowing through a selected column line and determines the data of the selected column line based on a result of the detection. The column circuit 340 includes a column decoder 341 and a sense amplifier 342. The column decoder 341 electrically connects a selected column line among the column lines BL1 to BLM with the sense amplifier 342 in response to a column address C_ADD and floats or grounds the remaining column lines. The sense amplifier 342 includes a current limiter 343 and a comparator 344. The current limiter 343 includes a transistor that is controlled by a bias voltage VBIAS, which has a voltage level close to the negative voltage VBB+the threshold voltage of the transistor, and functions to supply the negative voltage VBB to a selected column line. For reference, although the e-fuse of a selected memory cell is not programmed due to the defect of the gate oxide of the e-fuse, some current (for example, an electric current less than 1 µA) can flow. The bias voltage VBIAS is controlled so that a difference between an unwanted small amount of current caused by the defect of a selected e-fuse and a large amount of current (for example, an electric current equal to or higher than 10 µA) for programming the selected e-fuse may be determined, and thus, a sufficient amount of current may flow from a selected column. The comparator 344 is activated when a read operation is performed (for example, PG/RD='L') and configured to compare a reference voltage VREF and the voltage of a node A placed over the current limiter 343 and to sense data based on a result of the comparison. If a selected memory cell is programmed (ruptured) by the row decoder 331 and the column decoder 341, voltage of the node A does not maintain the level of the negative voltage VBB. Instead, the voltage of the node A becomes higher than the reference voltage VREF, because an electric current flows through the node A. As a result, the comparator 344 generates output data OUTPUT of a 'high' level. If a selected memory cell is not programmed by the row decoder 331 and the column decoder 341, an electric current does not flow through the node A (or a very small amount of current flows), and thus, voltage of the node A maintains the level of the negative voltage VBB. Accordingly, the comparator 344 generates the output data OUTPUT of a 'low' level. An example has been described above for an embodiment when a read operation is performed. In that embodiment, the negative voltage VBB is supplied to the node A by the current limiter 343, and voltage of the node A maintains or does not maintain the voltage level of the negative voltage VBB depending on whether there is an electric current flowing from a selected memory cell to the node A or not. In some embodiments, however, a precharge circuit for precharging the node A to the level of the negative voltage VBB before a read operation is performed may be further added.

In accordance with the present invention, when an e-fuse device is programmed (ruptured), the high voltage VPGM of 4 V is supplied to the gate of the e-fuse device, and the negative voltage VBB of −2 V is supplied to the drain/source of the e-fuse device. Therefore, a potential difference of 6V is supplied between the gate and drain/source of the e-fuse device. Furthermore, the deactivation voltage is −2V, and the activation voltage is 0V. That is, voltages having levels ranging from −2V to 4V may be used in the e-fuse array circuit. In this case, the following advantages may be obtained as compared with the case where voltages having levels ranging from 0V to 6V are used in the e-fuse array circuit. First, there may be advantages in terms of current consumption and stability. If voltages having levels ranging from 0V to 6V are sought to be used, a high voltage of 6V must be generated by pumping the power source voltage VDD having a level of about 1 to 2V. As a result, a large amount of current is inefficiently consumed by the high voltage pumping unit 310 to generate 6V. That is, an electric current necessary for the high voltage pumping unit 310 to generate the high voltage of 6V is greater than an electric current necessary for the high voltage pumping unit 310 to generate voltage of 4V in addition to an electric current necessary for the negative voltage pumping unit 320 to generate voltage of −2V. Furthermore, if the high voltage pumping unit 310 is designed to pump the high voltage of 6V, there is a high probability that the voltage generated from the high voltage pumping unit 310 may be unstable, which means that 6V may not be sustained continuously. Second, there may be an advantage in terms of an application to the e-fuse array circuit. The e-fuse array circuit may be used to store repair information in a DRAM chip or to store setting information necessary for the operation of a chip in a variety of IC chips. Furthermore, each of DRAM and most of IC chips is equipped with a high voltage pump and a negative voltage pump. Accordingly, when both a high voltage and a negative voltage are used, there may be an advantage in an application to the system of the e-fuse array circuit.

Figure 4:
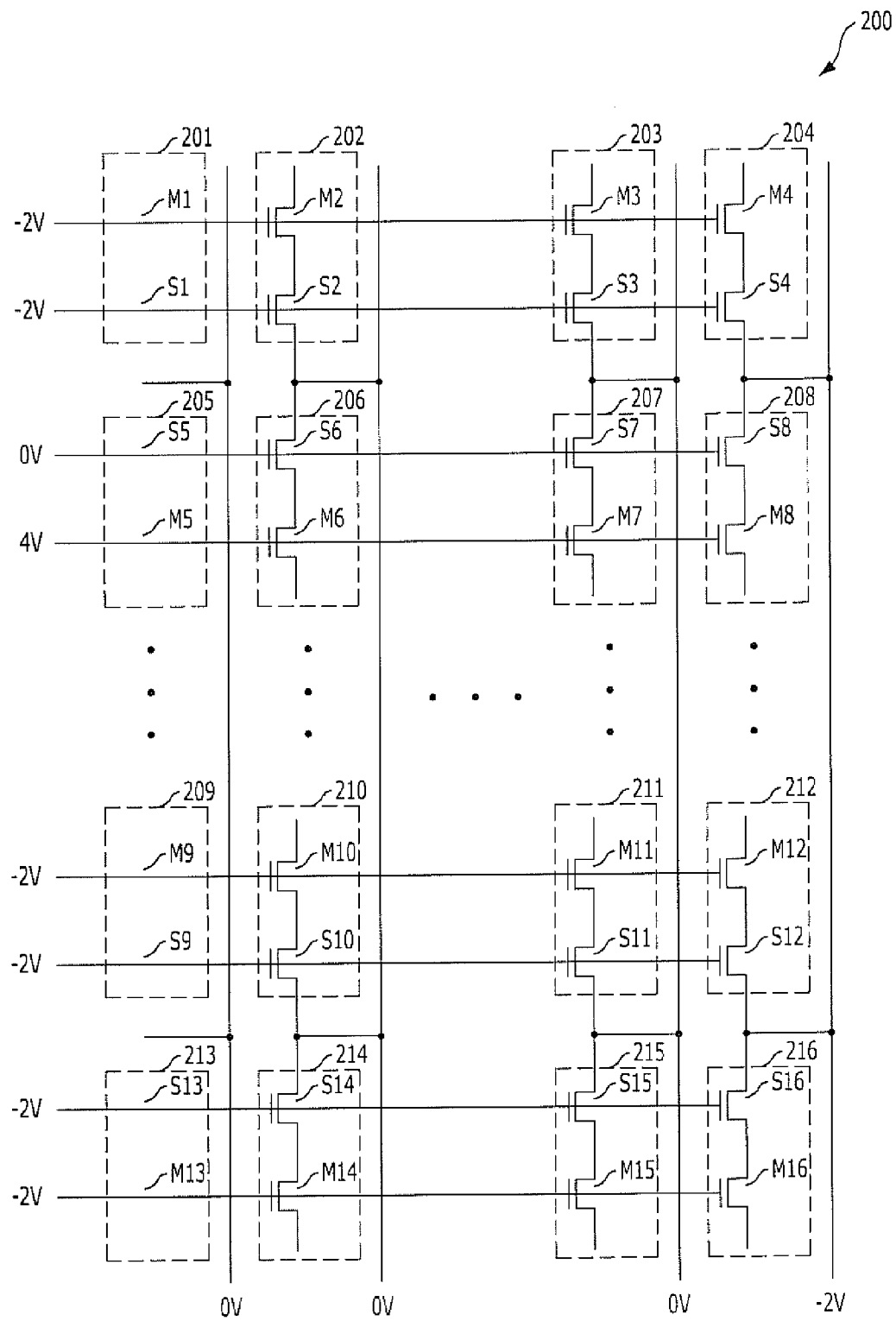
FIG. 4 is a circuit diagram illustrating the voltage levels supplied to row-series lines WLR1 to WLRN and WLP1 to WLPN and column lines BL1 to BLM when a program operation is performed.
Figure 5:
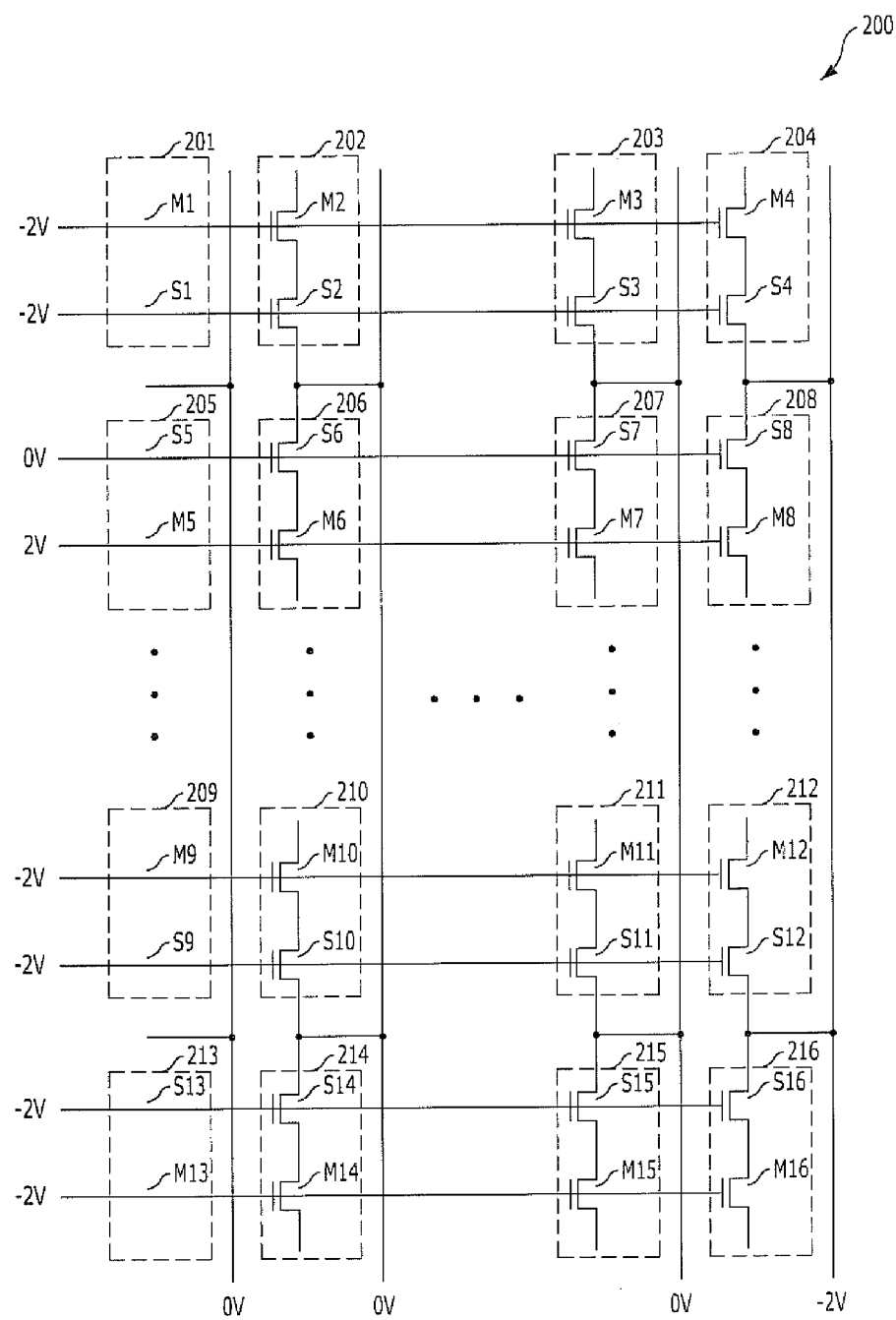
FIG. 5 is a circuit diagram illustrating the voltage levels supplied to the row-series lines WLR1 to WLRN and WLP1 to WLPN and column lines BL1 to BLM when a read operation is performed.

FIGS. 4 and 5 are diagrams showing the voltage levels supplied to the row-series lines WLR1 to WLRN and WLP1 to WLPN and the column lines BL1 to BLM when a selected row is a second row and a selected column is an $M^{th}$ column in the cell array 200. FIG. 4 illustrates the voltage levels supplied to the row-series lines WLR1 to WLRN and WLP1 to WLPN and the column lines BL1 to BLM when a program operation is performed, and FIG. 5 illustrates the voltage levels supplied to the row-series lines WLR1 to WLRN and WLP1 to WLPN and the column lines BL1 to BLM when a read operation is performed. From FIGS. 4 and 5, it can be clearly understood how the row circuit 330 and the column circuit 340 of FIG. 3 operate when the program or read operations are performed.

In accordance with the present invention, an area of an e-fuse array circuit may be reduced because a plurality of e-fuses can share an amplifier (a sense amplifier) by configuring the e-fuses in an array form. Furthermore, there may be an advantage in that the current consumption efficiency of voltage generation circuits may be increased by optimizing the voltage levels used in an e-fuse array circuit.

While the present invention has been described with respect to is the specific embodiments, it will be apparent to those skilled in the art that various changes and modifications may be made without departing from the spirit and scope of the invention as defined in the following claims.

What is claimed is:
1. An e-fuse array circuit, comprising:
  a high voltage pumping unit configured to generate a high voltage by pumping a power source voltage;
  a negative voltage pumping unit configured to generate a negative voltage by pumping a ground voltage;
  a program/read line supplied with the high voltage when a program operation is activated, a read voltage, which is lower than the high voltage, when a read operation is activated, or the negative voltage when deactivated;
  a row line supplied with the ground voltage when the row line is activated or the negative voltage when the row line is deactivated;
  an e-fuse device supplied with voltage of the program/read line;
  a switch device controlled by the row line and configured to electrically connect the e-fuse device with a column line; and
  a column circuit configured to supply the negative voltage to the column line when the column line is activated.

2. The e-fuse array circuit of claim 1, wherein the read voltage is divided from the power source voltage.

3. The e-fuse array circuit of claim 1, wherein the read voltage is the power source voltage.

4. The e-fuse array circuit of claim 1, wherein the column circuit supplies the ground voltage to the column line when the column line is deactivated.

5. The e-fuse array circuit of claim 1, wherein the high voltage has a level of approximately 3.5 to 4.5V, the read voltage has a level of approximately 1.5 to 2.5V, and the negative voltage has a level of approximately −1.5 to −2.5V.

6. An e-fuse array circuit, comprising:
a high voltage pumping unit configured to generate a high voltage by pumping a power source voltage;
a negative voltage pumping unit configured to generate a negative voltage by pumping a ground voltage;
a plurality of memory cells arranged in a plurality of rows and a plurality of columns, and each configured to comprise an e-fuse device and a switch device;
a plurality of program/read lines configured to control the e-fuse devices of the plurality of memory cells;
a plurality of row lines configured to control the switch devices of the plurality of memory cells;
a plurality of column lines electrically connected to the e-fuse devices through the switch devices of the plurality of memory cells;
a row circuit configured to supply the high voltage to a program/read line corresponding to a selected row when a program operation is performed, supply a read voltage, which is lower than the high voltage, to a program/read line corresponding to a selected row when a read operation is performed, supply the ground voltage to a row line corresponding to a selected row when program and read operations are performed, and supply the negative voltage to program/read lines and row lines corresponding to unselected rows when program and read operations are performed; and
a column circuit configured to supply the negative voltage to a column line corresponding to a selected column when program and read operations are performed.

7. The e-fuse array circuit of claim 6, wherein the column circuit supplies the ground voltage to column lines corresponding to unselected columns when program and read operations are performed.

8. The e-fuse array circuit of claim 6, wherein the column circuit comprises:
a column decoder configured to select one or more of the plurality of columns in response to a column address; and
a sense amplifier configured to supply the negative voltage to a column line selected by the column decoder when program and read operations are performed, check whether or not an electric current flows through the selected column line when a read operation is performed, and determine data of the selected column line based on a result of the check.

9. The e-fuse array circuit of claim 6, wherein the read voltage is divided from the power source voltage.

10. The e-fuse array circuit of claim 6, wherein the read voltage is the power source voltage.

11. The e-fuse array circuit of claim 6, wherein the high voltage has a level of approximately 3.5 to 4.5V, the read voltage has a level of approximately 1.0 to 2.0V, and the negative voltage has a level of approximately −1.5 to −2.5V.

* * * * *